(12) United States Patent
Bogorin et al.

(10) Patent No.: US 12,020,115 B2
(45) Date of Patent: Jun. 25, 2024

(54) TRAPPED ION ARCHITECTURE IN A DILUTION REFRIGERATOR FOR USE WITH SUPERCONDUCTING QUBIT SYSTEMS

(71) Applicant: INTERNATIONAL BUSINESS MACHINES CORPORATION, Armonk, NY (US)

(72) Inventors: Daniela Florentina Bogorin, Syracuse, NY (US); Nicholas Torleiv Bronn, Long Island City, NY (US); Patryk Gumann, Tarrytown, NY (US); Sean Hart, Tarrytown, NY (US); Salvatore Bernardo Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 221 days.

(21) Appl. No.: 17/026,245

(22) Filed: Sep. 20, 2020

(65) Prior Publication Data

US 2022/0092459 A1    Mar. 24, 2022

(51) Int. Cl.
  *G06N 10/00*    (2022.01)
  *F25B 9/12*    (2006.01)
  *H10N 60/12*    (2023.01)

(52) U.S. Cl.
  CPC ............... *G06N 10/00* (2019.01); *F25B 9/12* (2013.01); *H10N 60/12* (2023.02)

(58) Field of Classification Search
  CPC .............................. G06N 10/00; G06N 10/40
  See application file for complete search history.

(56) References Cited

U.S. PATENT DOCUMENTS

| | | | |
|---|---|---|---|
| 7,518,120 B2 | 4/2009 | Monroe et al. |
| 7,788,192 B2 | 8/2010 | Amin |
| 9,279,778 B2 | 3/2016 | Beckman et al. |
| 9,471,880 B2 | 10/2016 | Williams |
| 10,366,873 B2 | 7/2019 | Polfer et al. |
| 10,468,578 B2 | 11/2019 | Elsherbini et al. |
| 10,601,096 B2 | 3/2020 | Olivadese et al. |
| 2018/0114138 A1 | 4/2018 | Monroe et al. |

OTHER PUBLICATIONS

Florian et al., Trapping of Ultracold Atoms in a He/He Dilution Refrigerator. Applied Physics B. 116. 10.1007/s00340-013-5750-5. (Year: 2013).*
Peterer, M. 2016. "Experiments on Multi-Level Superconducting Qubits and Coaxial Circuit QED." PhD thesis, University of Oxford. (Year: 2016) https://ora.ox.ac.uk/objects/uuid:572f08ef-2d14-4fda-8e18-71f80fc4c47a.*

(Continued)

*Primary Examiner* — Matthew L Reames
(74) *Attorney, Agent, or Firm* — Intelletek Law Group, PLLC; Gabriel Daniel

(57) ABSTRACT

A quantum computing system includes a dilution refrigerator having a plurality of chambers. A trapped ion computing device includes a first set of qubits in a given chamber of the plurality of chambers of the dilution refrigerator. A superconducting computing device having a second set of superconducting qubits is inside the given chamber of the plurality of chambers of the dilution refrigerator.

15 Claims, 3 Drawing Sheets

(56) References Cited

OTHER PUBLICATIONS

F. Yoshihara, K. Harrabi, A. O. Niskanen, Y. Nakamura, and J. S. Tsai Phys. Rev. Lett. 97, 167001—Published Oct. 17, 2006 "Decoherence of Flux Qubits due to 1/f Flux Noise" (Year: 2006).*

K. Geerlings, Z. Leghtas, I. M. Pop, S. Shankar, L. Frunzio, R. J. Schoelkopf, M. Mirrahimi, and M. H. Devoret Phys. Rev. Lett. 110, 120501 - Published Mar. 20, 2013 "Demonstrating a Driven Reset Protocol for a Superconducting Qubit" (Year: 2013).*

Kim, T. et al., "Efficient Collection of Single Photons Emitted from a Trapped Ion into a Single Mode Fiber for Scalable Quantum Information Processing"; arXiv:1109.2268v1 (2011); 11 pgs.

De Motte, D. et al., "Experimental System Design for the Integration of Trapped-ion and Superconducting Qubit Systems"; arXiv:1510.07298v3 (2016); 22 pgs.

Brandl, M.F., et al., "Cryogenic Setup for Trapped Ion Quantum Computing"; arXiv:1607.04980v1 (2016); 12 pgs.

Michael, J. et al., "A New Quantum Processor Architecture"; 2019 IEEE 10th Annual Ubiquitous Computing, Electronics, Mobile Communication Conference (2019); pp. 483-487.

International Search Report and Written Opinion issued Feb. 8, 2022 in related application No. PCT/EP2021/075721; 13 pgs.

\* cited by examiner

TRAPPED ION ARCHITECTURE IN A DILUTION REFRIGERATOR FOR USE WITH SUPERCONDUCTING QUBIT SYSTEMS

BACKGROUND

Technical Field

The present disclosure generally relates to superconducting devices, and more particularly, to integration of superconducting qubit and trapped ion systems.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

In recent years, the advancement of quantum technologies has ushered the implementation of qubits in different physical systems including superconducting qubits, ions, and others. While each system has its own benefits, each system operates in a different environment that is not readily integrated.

SUMMARY

According to one embodiment, a quantum computing system, includes a dilution refrigerator comprising a plurality of chambers. There is a trapped ion computing device that includes a first set of qubits in a given chamber of the plurality of chambers of the dilution refrigerator. A superconducting computing device includes a second set of superconducting qubits inside the given chamber of the plurality of chambers of the dilution refrigerator.

In one embodiment, the second set of superconducting qubits are in a mixing chamber nested within the given chamber of the plurality of chambers. The mixing chamber can be at a lower temperature than the given chamber.

In one embodiment, the mixing chamber is at 10 to 20 mK, and the given chamber is at 100 mK.

In one embodiment, the mixing chamber further comprises filters and/or isolators coupled to the second set of superconducting qubits.

In one embodiment, the plurality of chambers is nested and includes an outer vacuum shield, a second chamber nested in the outer vacuum shield, a third chamber nested in the second chamber, a fourth chamber nested in the third chamber, a fifth chamber corresponding to the given chamber and nested in the fourth chamber, and a sixth chamber corresponding to the mixing chamber.

In one embodiment, the outer vacuum shield is an approximately 300 K shield, the second chamber is an approximately 50 K shield, the third chamber is an approximately 4 K shield, the fourth chamber is an approximately 700 to 800 mK shield, the fifth chamber is an approximately 100 mK shield, and the sixth chamber is an approximately 10 to 20 mK shield.

In one embodiment, the given chamber includes one or more optical fibers coupled to an ion trap of the ion computing device.

In one embodiment, the ion computing device is housed in a copper (Cu) can.

In one embodiment, the Cu can is configured for thermal and radiation shielding and includes one or more holes for optical fibers and an ion beam entrance.

In one embodiment, the ion trap is anchored on a still flange inside the third chamber.

In one embodiment, the still flange is at 700 to 800 mK.

In one embodiment, the ion trap is anchored on a 4 K flange.

In one embodiment, the ion trap is anchored on a cold plate of the fifth chamber.

According to one embodiment, a method includes providing a dilution refrigerator with a plurality of chambers. A trapped ion computing device comprising a first set of qubits is housed in a given chamber of the plurality of chambers of the dilution refrigerator. A superconducting computing device comprising a second set of superconducting qubits is provided inside the given chamber of the plurality of chambers of the dilution refrigerator.

In one embodiment, the second set of superconducting qubits are housed in a mixing chamber nested within the given chamber of the plurality of chambers.

In one embodiment, the mixing chamber is operated at a lower temperature than the given chamber.

In one embodiment, an outer vacuum shield of the dilution refrigerator is provided at approximately 300 K.

In one embodiment, a second chamber of the plurality of chambers is operated with an approximately 50 K shield.

In one embodiment, a third chamber of the plurality of chambers with is operated with an approximately 4 K shield.

In one embodiment, a fourth chamber of the plurality of chambers is operated with an approximately 700 to 800 mK shield.

In one embodiment, a fifth chamber of the plurality of chambers is operated with an approximately 100 mK cold plate shield.

In one embodiment, a sixth chamber of the plurality of chambers is operated with an approximately 10 to 20 mK shield.

In one embodiment, an optical fiber is coupled to an ion trap of the ion computing device in the given chamber.

In one embodiment, the ion computing device is housed in a copper (Cu) can.

In one embodiment, the Cu can is configured for thermal and radiation shielding.

In one embodiment, one or more holes are provided for optical fibers and an ion beam entrance.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 1 illustrates an example architecture of a quantum computing system, consistent with an illustrative embodiment.

DETAILED DESCRIPTION

Overview

Figure 1:
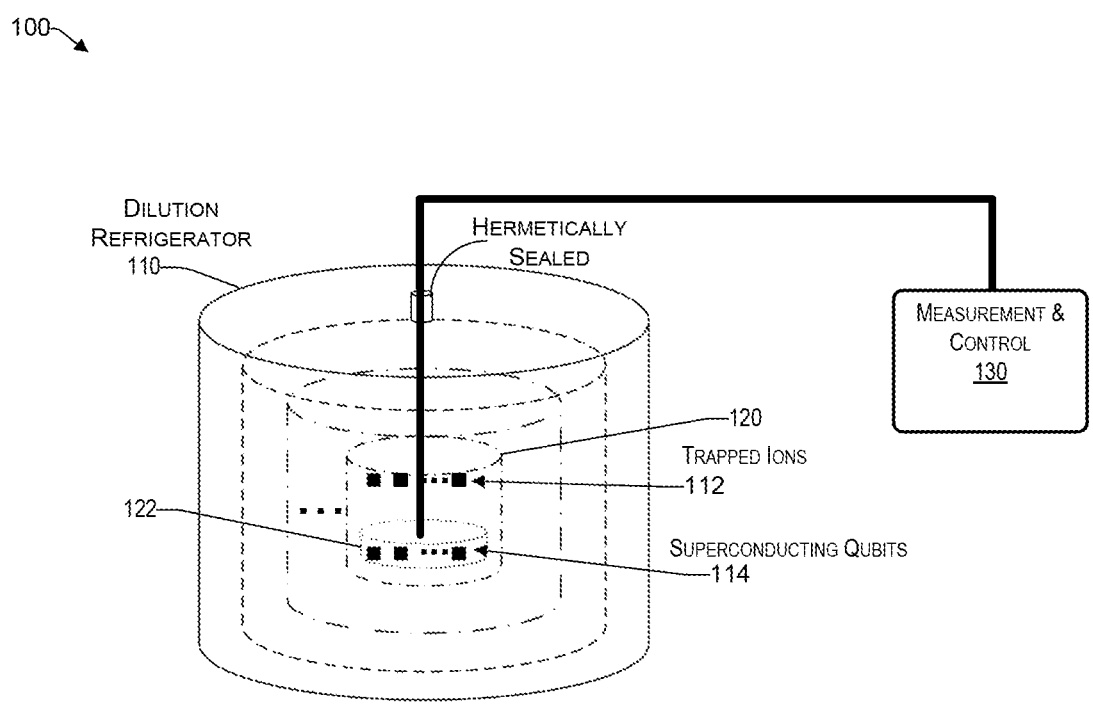

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

Although the terms first, second, third, etc. may be used herein to describe various elements, these elements should not be limited by these terms. These terms are only used to distinguish one element from another. For example, a first element or nested chamber could be termed a second element or nested chamber, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape or proportional scale of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

The present disclosure generally relates to superconducting devices, and more particularly, to combining attributes of different types of quantum technologies, namely superconducting qubits and trapped ions. Superconducting qubits provide fast gate times and lend themselves to scalable architectures. However, superconducting qubits typically have short coherence times and do not provide an efficient way of long-term storage. Further, they involve particular hardware overhead, such as dilution refrigerators.

In contrast, trapped ions provide low interaction with the environment and provide much longer coherence times than superconducting qubits. However, trapped ions have longer gate times. Further, trapped ions may require specific hardware, such as lasers or magnetic fields and they are immersed in ultra high vacuum. For example, lasers are applied to induce coupling between the qubit states (for single qubit operations) or coupling between the internal qubit states and the external motional states (e.g., for entanglement between qubits).

Two salient tasks for quantum computation involve processing and storage of information. The teachings herein provide a hybrid architecture that involves both superconducting qubits as well as trapped ions, thereby levering the benefits of both technologies for an overall more efficient quantum computing device. In a quantum hybrid system, quantum computation processes, such as quantum logic gates, can be implemented in one technology, whereas another technology can be used to store the information for a longer duration. However, a hybrid system involves various challenges. Much of the process of superconducting qubits is performed in a cold environment (e.g., in a cryogenic chamber), while the microwave signal of a qubit is ultimately measured at room temperature. The amplitude and/or phase of the returned/output microwave signal carries information about the qubit state, such as whether the qubit has dephased to the ground or is in an excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

A qubit system may include one or more readout resonators coupled to the qubit. A readout resonator may be a transmission line that includes a capacitive connection to ground on one side and is either shorted to the ground on the other side, such as for a quarter wavelength resonator, or may have a capacitive connection to ground, such as for a half wavelength resonator, which results in oscillations within the transmission line, with the resonant frequency of the oscillations being close to the frequency of the qubit. For example, the readout resonator affects a pulse coming from the control/measurement instruments at the readout resonator frequency. The pulse acts as a measurement that decoheres the qubit and makes it collapse into a state of "one" or "zero," thereby imparting a phase shift on that measurement pulse.

Between qubits there may be a coupling resonator, sometimes referred to herein as a coupler resonator or RIP bus, which allows coupling different qubits together in order to realize quantum logic gates. The coupling resonator is typically structurally similar to the readout resonator. However, more complex designs are possible. When a qubit is implemented as a transmon, each side of the coupling resonator is coupled (e.g., capacitively or inductively) to a corresponding qubit by being in adequate proximity to (e.g., the capacitor of) the qubit. Since each side of the coupling resonator has coupling with a respective different qubit, the two qubits are coupled together through the coupling resonator. In this way, there is mutual interdependence in the state between coupled qubits, thereby allowing a coupling resonator to use the state of one qubit to control the state of another qubit. Entanglement occurs when the interaction between two qubits is such that the states of the two cannot be specified independently but can only be specified for the whole system. In this way, the states of two qubits are linked together such that a measurement of one of the qubits, causes the state of the other qubit to collapse.

Generally, in superconducting qubits, performance increases as the temperature is lowered, for example by reducing the residual thermally-excited state qubit population and decreasing the thermal broadening of the qubit transition frequencies. Accordingly, the lower the temperature, the better for a superconducting quantum processor. Superconducting qubits are therefore housed in a cryogenic environment.

In contrast, trapped ions are typically not operated in low temperature cryogenic environments-dilution refrigerators. Typical trapped ion setups are operated at room temperature in ultra-high vacuum chambers or in small Helium-4 cryostats. It is known that trapped ions at ~4K perform better in terms of coherence and gate fidelity than room temperature trapped ions independent of the ion species. Preparation of ions is typically performed by heating an atomic source material in an oven, which is then followed by photoionization.

A trapped ion quantum computer is a quantum computer where ions, or charged atomic particles, can be confined and suspended in free space using electromagnetic fields. Qubits can be stored in stable electronic states of each ion. The quantum information therefrom can be transferred through the collective quantized motion of the ions in a shared trap by applying laser beams. Ions can be laser cooled. In one embodiment, ions trapped in an ultra-high vacuum have a weak interaction with their environment and can be easily directed with magnetic fields. A superconducting qubit provides fast gates and is well suited for fast processing, such as those in quantum processors.

It has been recognized that by leveraging some of the benefits of both trapped ions and superconducting qubits in a hybrid architecture, a network of quantum processors can be developed. Combining both qubit embodiments within one experimental setup can serve as an excellent testbed for frequency transduction between GHz to Optical and Terahertz frequencies. Accordingly, the teachings herein provide methods and systems of harmonizing both technologies in a common dilution refrigerator.

In one aspect, the teachings herein are based on Applicants' insight that directly applying conventional integrated circuit techniques for interacting with computing elements to superconducting quantum circuits, whether related to trapped ions or superconducting qubits, may not be effective because of the unique challenges presented by trapped ions and quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits and ion traps, and, in particular, to electing methods and architectures used for interacting efficiently with qubits of both types.

Example Architecture

FIG. 1 illustrates an example architecture 100 of a quantum computing system, consistent with an illustrative embodiment. The architecture 100 includes a quantum processor comprising trapped ions (i.e., qubits) 112 and superconducting qubits 114 inside one of the nested chambers 120 of a refrigeration unit, which may be a dilution refrigerator 110. A dilution refrigerator is a cryogenic device that provides continuous cooling to temperatures typically at about 10 mK. Most of the physical volume of the architecture 100 is due to the large size of the refrigeration unit 110. To reach the near-absolute zero temperatures at which the system operates, the refrigeration unit 110 may use a mixture of He3-H4 as a coolant. In one embodiment, the superconducting qubits 114 are in a chamber 122 further nested in the common chamber 120, thereby allowing the superconducting qubits to be at a temperature lower than that of the trapped ions 112. Each of the nested chambers 202 to 212 of the dilution refrigerator 110 provides a progressively colder environment, discussed in more detail later.

In one embodiment, there is a measurement and control unit 130 that is outside of the refrigeration unit 110. The measurement and control unit 130 is able to communicate with the quantum computing system through a number of microwave carrying coax cables and DC control lines that run from the lowest temperature stage of the dilution refrigerator to outside to the measurements and control unit. It will be understood that while a single line is shown, it represents not just one wire but a multiple of connectors for both the ion trapping setup and for superconducting qubits setup. In various embodiments, the connectors are of multiple types: microwave, DC, optical fibers.

For ion trapping control a series of optical fibers are added that run from the Cold Plate to outside the dilution refrigerator. Both coax cables and optical fibers are hermetically sealed at the top of the refrigerator separating the ambient atmospheric pressure from the vacuum pressure of the cryostat under operation.

The teachings herein are applicable in various applications, including, without limitation, networks of quantum processors with memory nodes, as well as quantum transduction between THz optical communication and GHz communication domains and quantum computing application.

Example Block Diagram

Figure 2:
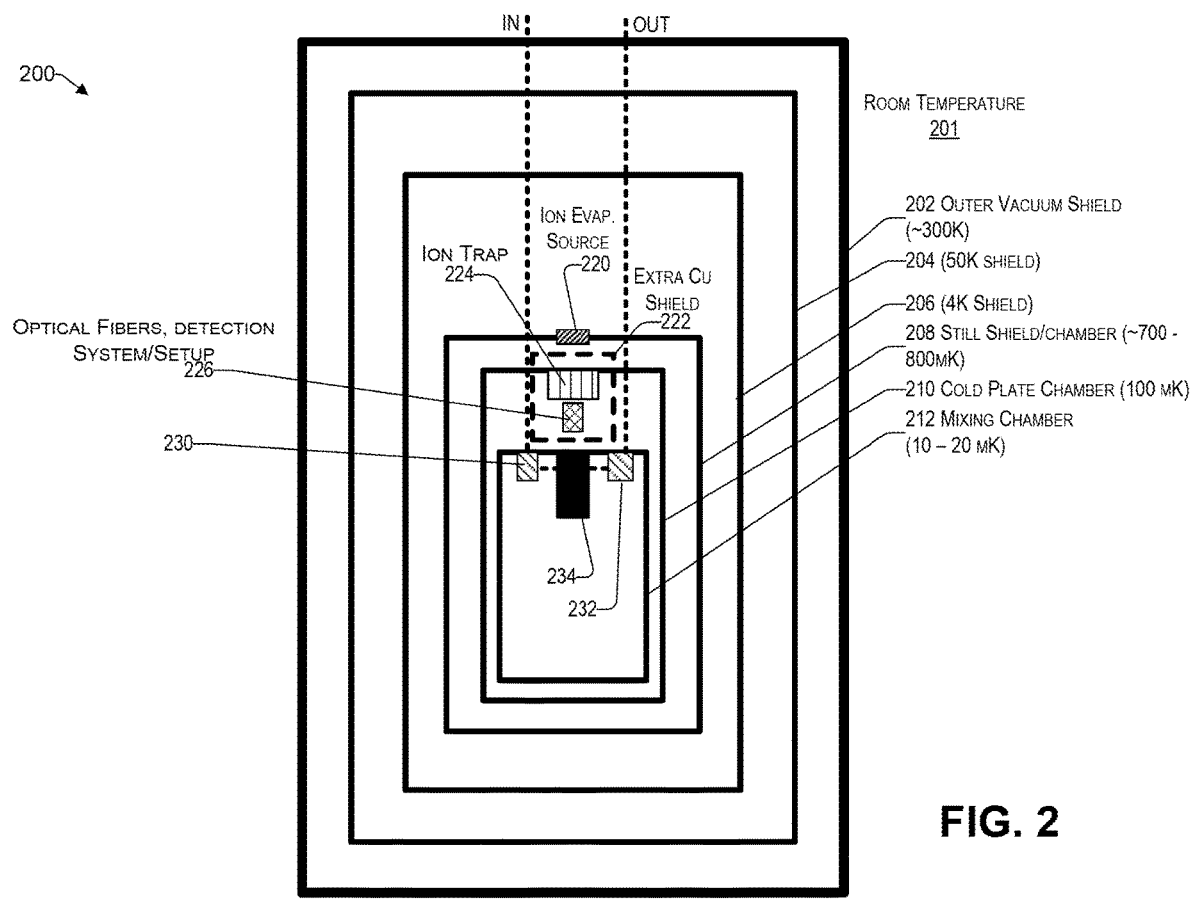
FIG. 2 illustrates an architecture of a hybrid setup that includes a superconducting quantum computer and an ion trapping quantum computer in a common dilution refrigerator, consistent with an illustrative embodiment.

FIG. 2 illustrates an architecture of a hybrid setup 200 that includes a superconducting quantum computer and an ion trapping quantum computer in a common dilution refrigerator, consistent with an illustrative embodiment. The hybrid architecture 200 is in a refrigerated environment, which may be a dilution refrigerator. The refrigerated environment includes a plurality of nested chambers 204, 206, 208 210, and 212, each providing a progressively colder environment from room temperature 201 outside the dilution refrigerator 200 to approximately 10 to 20 mK in the mixing chamber 212.

In one embodiment, there is an outer vacuum shield 202. The outer vacuum shield 202 is sometimes referred to herein as a first chamber, which houses the nested chambers 204 to 212. The second chamber 204 is a 50 K shield, thereby keeping its contents at approximately 40-50 K. The third chamber 206 is a 4 K shield, thereby keeping its contents at approximately 3.5 to 4 K. The fourth chamber 208 includes the still shield/chamber, which is at approximately 700 to 800 mK. The fifth chamber 210 includes the cold plate (CP) flange 220 that is at approximately 100 mK.

The fifth chamber 210 includes the ion trap 224 as well as a detection system for ions. The detection system can be an optical fiber/fibers 226 mounted on XYZ positioners that control the movement with micrometer precision. The ion trap 224 is mounted on the Cold Plate flange of the dilution refrigerator. In one embodiment, the ion trap 224 and the optical fiber 226 are in a supplementary copper (Cu) shield 222, coated with a superconducting material sometimes referred to herein as a Cu can. Ion detection is performed in the fifth chamber 210, at the temperature of the cold plate. The superconducting qubits are thermalized to the mixing plate and hosted inside the sixth chamber 212, sometimes referred to herein as the mixing chamber. The fifth chamber 210 is at a temperature at that is higher than the nested mixing chamber 212. In one embodiment, ion detection is performed via optical fiber 226 positioned underneath the ion trap 224. In various embodiments, the ion trap, which performs the ion detection, can be anchored on the cold plate of the fifth chamber 210 at ~100 mK or the sixth (i.e., mixing) chamber 212. In another embodiment, the ion trap 224 can be anchored on the CP still flange 220.

Ions are generated and evaporated onto the ion trap 224 from the still flange 220. In one embodiment, there is a copper (Cu) shield 222, sometimes referred to herein as a Cu can, which is around the ion trap 224. The Cu shield 222 is configured for thermal and radiation shielding. The Cu shield 222 may include holes for wiring (e.g., optical fibers and ion beam entrance, DC, etc.). In one embodiment, the Cu shield can be coated with a superconducting layer. In various embodiments, the Cu shield 222 can be mounted on the cold plate shield and still shield.

The ion evaporation oven can be anchored on the still flange 220 or the 4 K flange where the cooling power is higher. Ions are directed via capillaries towards the trapping area (ion trap 224). Laser beams can be focused towards the ion trap 224 using optical fibers 226 or free space for the ion qubit control and detection. Uniform magnetic fields for confining the ions are created by Helmholtz coils manufactured of superconducting materials and anchored around the ion trap inside the 222 Cu shield. In one embodiment, cryogenic positioners can be used for moving the ion detection part of the setup, in the case the optical fiber or other detection embodiment will be mounted on a cryogenic positioner that can allow precision movement on the horizontal x,y or vertical z with micrometer size precision. A close proximity position underneath the ion trap for the detection setup will greatly increase the ion detection efficiency. In another embodiment one can use high efficiency single photon detectors that operate at temperatures of 100-300 mK for detection. Some types of detectors are cryogenic nanowire detectors, transition edge sensors or kinetic inductance detectors. These types of detectors can be mounted below the cold plate and anchored on the top of the mixing plate or can be mounted on brackets hanging from the cold plate.

As mentioned above, the sixth (mixing) chamber 212 houses the superconducting qubits and associated microwave control/filtering circuits. In one embodiment, the qubits 234 in the sixth chamber 212 are coupled to other components for microwave control like, directional couplers, filters, isolators, attenuators, circulators, amplifiers, and other supporting circuitry of the superconducting qubits 234, represented by boxes 230 and 232. The architecture 200 of the setup is modular in that the superconducting qubits quantum processor is kept at a lower temperature chamber 212 and away from the possible harmful radiation from the ion trap 224.

In the hybrid architecture 200 of FIG. 2, both a superconducting qubit quantum computer (represented by qubits 234 and supporting circuitry 230 and 232) and an ion trapping quantum computer (represented by the ion trap 224 and optical fiber 226) can be controlled and function in the same cryogenic environment (e.g., chamber 208). As discussed above, a cryogenic ion trapping setup at lower temperatures (e.g., <1 K) can produce longer lived qubits with gates of higher fidelity and quantum efficiency. Architecture 200 provides direct ion qubit detection (via optical fibers 226) with higher efficiency by way of positioning the superconducting qubits 234 in close proximity of the ion trap 224. In one embodiment, the detected photons can be directed towards a frequency conversion setup and converted to microwave radiation that can be used, for example, for superconducting qubit control within the same architecture.

Example Process

Figure 3:
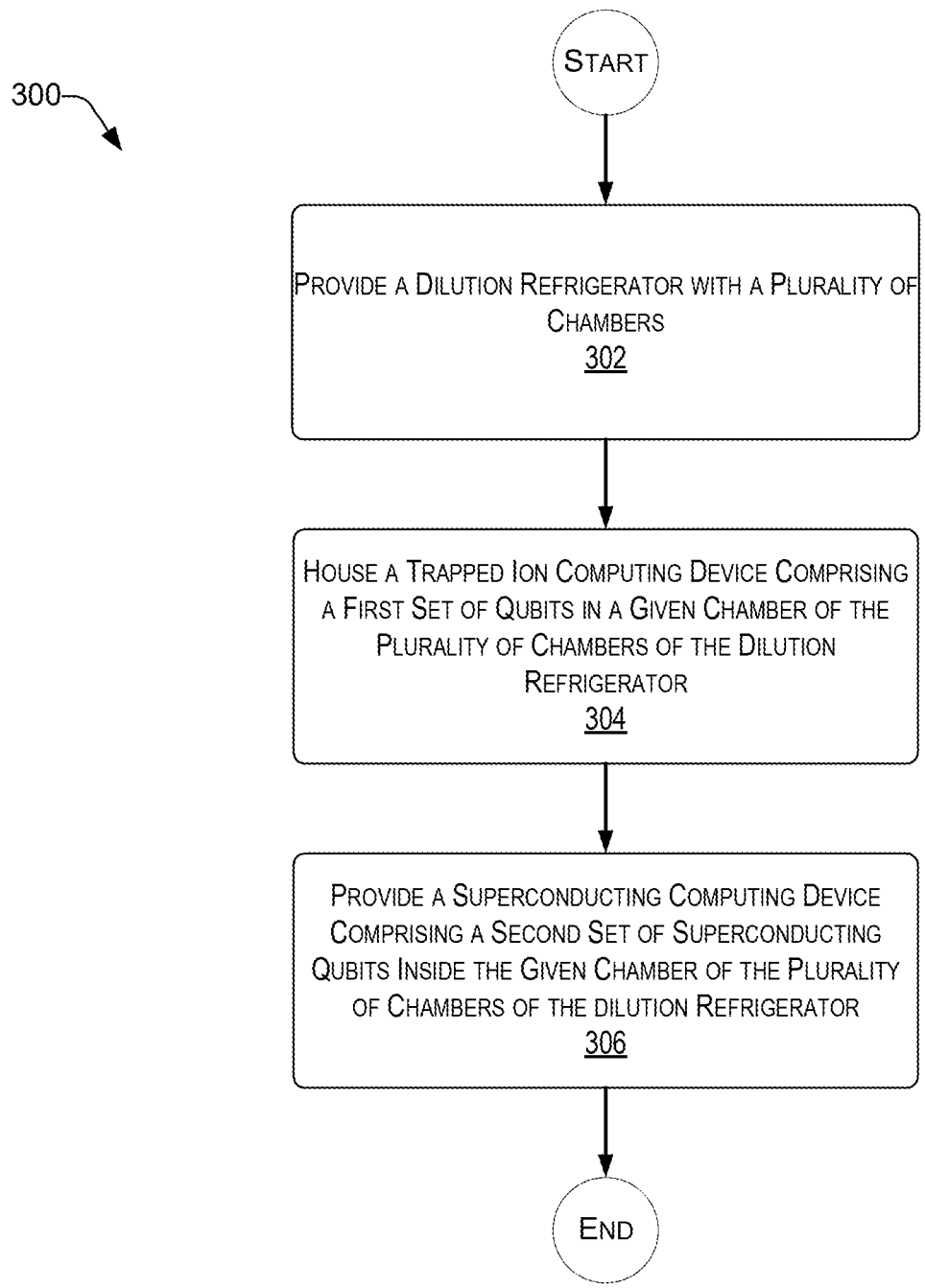
FIG. 3 describes an example process of combining a superconducting quantum computer and an ion trapping computer in a common dilution refrigerator, consistent with an illustrative embodiment.

With the foregoing overview of the example architecture, it may be helpful now to consider a high-level discussion of an example process. To that end, FIG. 3 presents an illustrative process related to integrating a superconducting qubit and trapped ion system in a same dilution refrigerator.

At block 302, a dilution refrigerator is provided with a plurality of chambers. Each of these chambers is nested, where the temperature is progressively lower the deeper the nesting.

At block 304, a trapped ion computing device comprising a first set of qubits is housed in a given chamber of the plurality of chambers of the dilution refrigerator.

At block 306, a superconducting computing device comprising a second set of superconducting qubits is placed inside the given chamber of the plurality of chambers of the dilution refrigerator. By virtue of placing the superconducting computing device in close proximity to the trapped ion computing device in the same dilution refrigerator, a hybrid architecture can be developed for quantum computing and communication applications.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of an appropriately configured computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A quantum computing system, comprising:
a dilution refrigerator comprising a plurality of chambers;
a trapped ion computing device comprising a first set of qubits anchored on a cold plate or a still flange in a given chamber of the plurality of chambers of the dilution refrigerator; and
a superconducting computing device comprising a second set of qubits that are superconducting inside the given chamber of the plurality of chambers of the dilution refrigerator,
wherein the second set of superconducting qubits are in a mixing chamber nested within the given chamber of the plurality of chambers, wherein:

the mixing chamber is at 10 to 20 mK, and
the given chamber is at 100 mK.

2. The system of claim 1, wherein the mixing chamber further comprises filters and/or isolators coupled to the second set of superconducting qubits.

3. The system of claim 1, wherein the plurality of chambers is nested and comprises:
an outer vacuum shield;
a second chamber nested in the outer vacuum shield;
a third chamber nested in the second chamber;
a fourth chamber nested in the third chamber;
a fifth chamber corresponding to the given chamber and nested in the fourth chamber; and
a sixth chamber corresponding to the mixing chamber.

4. The system of claim 3, wherein:
the outer vacuum shield is an approximately 300 K shield;
the second chamber is an approximately 50 K shield;
the third chamber is an approximately 4 K shield;
the fourth chamber is an approximately 700 to 800 mK shield;
the fifth chamber is an approximately 100 mK shield; and
the sixth chamber is an approximately 10 to 20 mK shield.

5. The system of claim 1, wherein the given chamber includes one or more optical fibers coupled to an ion trap of the ion computing device.

6. The system of claim 5, wherein the ion computing device is housed in a copper (Cu) can.

7. The system of claim 6, wherein the Cu can is operative to provide thermal and radiation shielding and includes one or more holes for optical fibers and an ion beam entrance.

8. The system of claim 5, wherein the ion trap is anchored on the still flange inside a fourth chamber.

9. The system of claim 8, wherein the still flange is at 700 to 800 mK.

10. The system of claim 5, wherein the ion trap is anchored on a 4 K flange.

11. The method of claim 5, wherein the ion trap is anchored on the cold plate of a fifth chamber.

12. A method, comprising:
providing a dilution refrigerator with a plurality of chambers;
housing a trapped ion computing device comprising a first set of qubits anchored on a cold plate or a still flange in a given chamber of the plurality of chambers of the dilution refrigerator;
providing a superconducting computing device comprising a second set of qubits that are superconducting inside the given chamber of the plurality of chambers of the dilution refrigerator; and
housing the second set of superconducting qubits in a mixing chamber nested within the given chamber of the plurality of chambers, wherein:
the mixing chamber is at 10 to 20 mK, and
the given chamber is at 100 mK.

13. The method of claim 12, further comprising:
providing an outer vacuum shield of the dilution refrigerator at approximately 300 K;
operating a second chamber of the plurality of chambers with an approximately 50 K shield;
operating a third chamber of the plurality of chambers with an approximately 4 K shield;
operating a fourth chamber of the plurality of chambers with an approximately 700 to 800 mK shield;
operating a fifth chamber of the plurality of chambers with an approximately 100 mK cold plate shield; and
operating a sixth chamber of the plurality of chambers with an approximately 10 to 20 mK shield.

14. The method of claim 12, further comprising, coupling an optical fiber to an ion trap of the ion computing device in the given chamber.

15. The method of claim 14, further comprising:
housing the ion computing device in a copper (Cu) can operative for thermal and radiation shielding; and
providing one or more holes for optical fibers and an ion beam entrance.

* * * * *